United States Patent [19]

Ando

[11] 4,363,963

[45] Dec. 14, 1982

[54] SOLID STATE PHOTO-ELECTRIC CONVERTING DEVICE AND SOLID STATE IMAGING APPARATUS EMPLOYING IT

[75] Inventor: Fumihiko Ando, Yokohama, Japan

[73] Assignee: Nippon Hoso Kyokai, Tokyo, Japan

[21] Appl. No.: 124,697

[22] Filed: Feb. 26, 1980

[30] Foreign Application Priority Data

Mar. 8, 1979 [JP] Japan .................................. 54-27151

[51] Int. Cl.³ ............................................ H01J 40/14
[52] U.S. Cl. ................................ 250/211 J; 250/578; 357/30; 357/31
[58] Field of Search ............... 250/211 J, 578; 357/30, 357/31

[56] References Cited

FOREIGN PATENT DOCUMENTS 1533615 of 0000 United Kingdom .
1480411 of 0000 United Kingdom .
1444543 of 0000 United Kingdom .
1365690 of 0000 United Kingdom .

OTHER PUBLICATIONS

*IEEE Journal of Solid-State Circuits* (S. G. Chamberlain)

*Primary Examiner*—David C. Nelms
*Assistant Examiner*—Darwin R. Hostetter
*Attorney, Agent, or Firm*—Stevens, Davis, Miller & Mosher

[57] ABSTRACT

A solid state photo-electric converting device consists of a direct conjunction of a photo-electric converting layers formed of satisfactorily selected materials and a solid state amplifier formed, for instance, of an FET, a conductive electrode being inserted therebetween for collecting signal charges induced in those converting layers efficiently, thereby an excellent spectral sensitivity performance and an extremely high conversion efficiency being realizabe. Accordingly, a solid state imaging apparatus employing a matrix of the above converting devices can be provided with an excellent spectral and noiseless performance.

20 Claims, 27 Drawing Figures

Portion Contained in (FIG.3a)

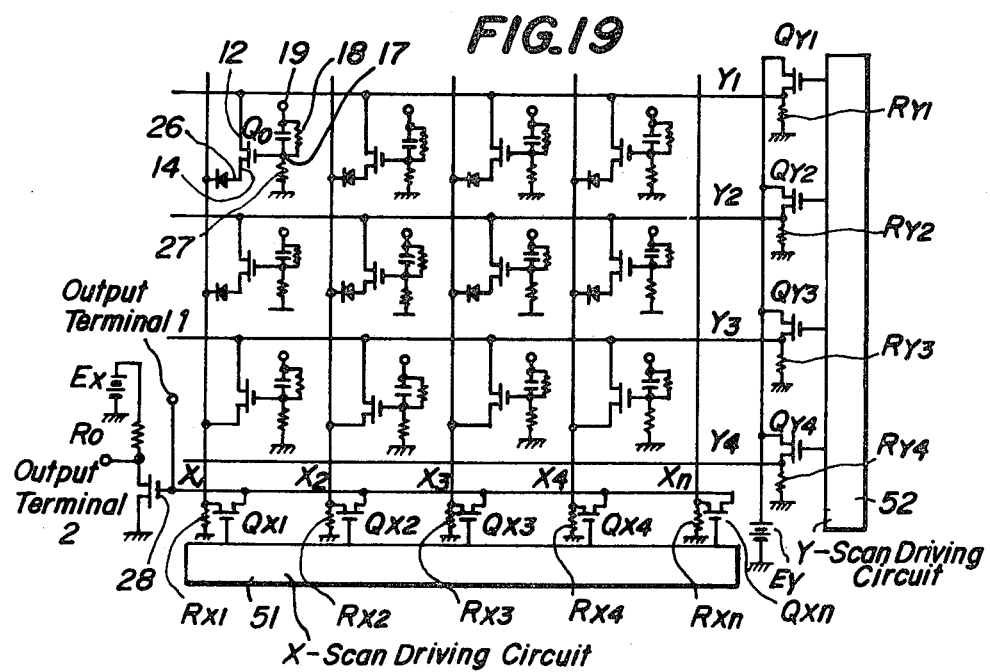

SOLID STATE PHOTO-ELECTRIC CONVERTING DEVICE AND SOLID STATE IMAGING APPARATUS EMPLOYING IT

BACKGROUND OF THE INVENTION (1) Field of the Invention

The present invention relates to a photo-electric converting device having an excellent performance for converting an optical information into an electric signal by the working of solid state elements and to a solid state imaging apparatus employing it.

(2) Description of the Prior Art

Various kinds of photo-electric converting devices have been used in various fields of technique, and those devices have various constructions and various performances according to the various purposes of usage respectively.

Particularly, for the purpose for converting an optical image into an electrical picture signal in a television camera, such a performance is required severely for those devices that a minute amount of incoming light can be converted into an electric signal with a high efficiency and a favourable signal to noise ratio and further output signals of conversion can be obtained uniformly in a wide range of wavelength of the incoming light with an excellent spectral performance. Moreover, those devices of solid state have been looked forward to because of the capability of miniaturization, the high stability and the high reliability thereof.

According to the above points of view, photo-diodes consisting of p-n junctions have been employed recently for the above mentioned purpose in place of phototubes and camera tubes which have been used for the above purpose for a long time, and the practised development of the solid state television camera has been tried, so as to promote the solidification of the photo-electric converting device positively.

However, the photo-electric converting device having a satisfactory performance cannot be realized at all for the present.

SUMMARY OF THE INVENTION

An object of the present invention is to provide a solid state photo-electric converting device having a high efficiency of conversion of an incoming light into an electric output and an excellent spectral performance.

Another object of the present invention is to realize a solid state television camera provided with a matrix of the aforesaid solid state photo-electric converting devices having a high efficiency of conversion, a high signal to noise ratio and an excellent spectral performance.

In an photo-diode which is formed of a silicon p-n junction and is used as a photo-electric converting element conventionally, pairs of electron and hole are generated by the light incoming near by the p-n junction thereof, and minority carriers among them are collected and accumulated in a junction capacitance thereof, so as to effect the photo-electric conversion, in which a pair of electron and hole is generated by a photon incoming near the junction have respectively different energies based on the difference of wavelength of the incoming light, so that different lengths of penetration of those incoming photons into the silicon layer are caused by those different energies thereof. Consequently, the positions at which the pairs of electron and hole are generated are distributed in the silicon layer near the junction. As a result thereof, the ununiformity of the efficiency of photo-electric conversion is caused by the difference of the collection efficiency of the minority carriers, based on the difference of times and distances required for collecting them into the aforesaid junction capacitance. For instance, the spectral sensitivity of the ordinary photo-diode is low in a range of shorter wavelength of the incoming light including the blue light, whilst that is high in another range of longer wavelength thereof including the red light.

According to the mentioned above, the efficiency of photo-electric conversion of the ordinary photo-diode is lower than unity, and further the practically attained performance of spectral sensitivity thereof is fairly ununiform, although the uniformity thereof is desired in a whole visible range for the purpose of usage, for instance, in the television camera, so that both of the conversion efficiency and the performance of spectral sensitivity thereof are unsatisfactory.

The feature of the present invention consists in that a solid state photo-electric converting device, from which the above-mentioned defects can be removed, having a high conversion efficiency and an excellent performance of spectral sensitivity can be realized by combining a photo-electric converting section formed of a solid state material having an excellent physical property relating to the spectral sensitivity and a solid state amplifying section provided with each other as a unitary structure for amplifying an electric output signal applied directly therefrom.

The present invention will be explained in greater detail hereinafter by referring to the accompanied drawings.

Figure 7:
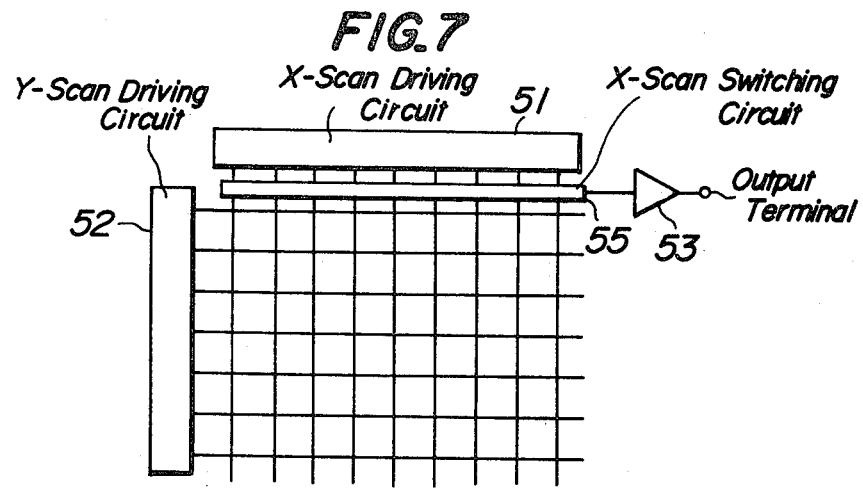
Figure 8A:
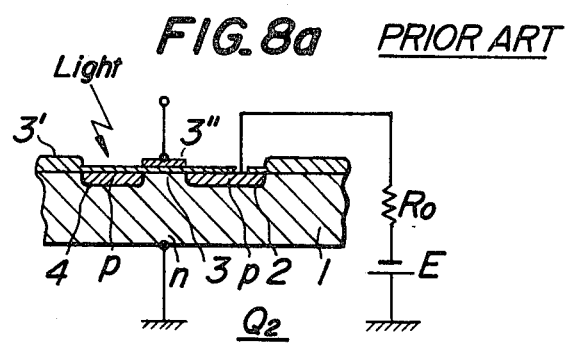
Figure 8B:
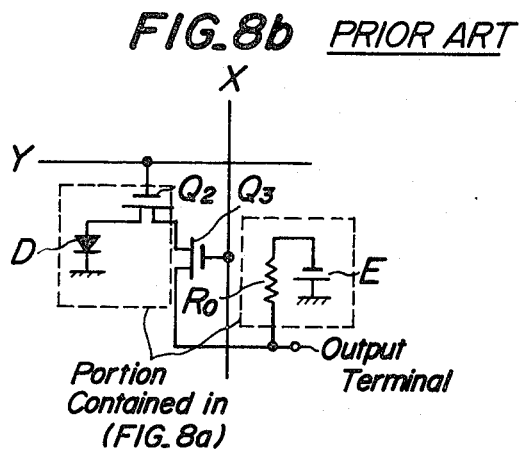

FIGS. (a) and (b) of FIGS. 2 to 6 are cross-sectional views and circuit diagrams showing respectively structures and equivalent circuits thereof of respectively different preferred embodiments of the present invention;

FIG. 7 is a schematic diagram showing a basic configuration of a solid state television camera employing solid state photo-electric converting devices according to the present invention;

FIGS. 8(a) and (b) are a cross-sectional view and a circuit diagram showing respectively a structure and an equivalent circuit thereof of a conventional solid state photo-electric converting element; and FIGS. 9 to 19 are schematic circuit block diagrams showing respectively different preferred embodiments of the solid state imaging apparatus employing solid state photo-electric converting devices according to the present invention.

DESCRIPTION OF THE PREFERRED EMBODIMENTS

Figure 1A:
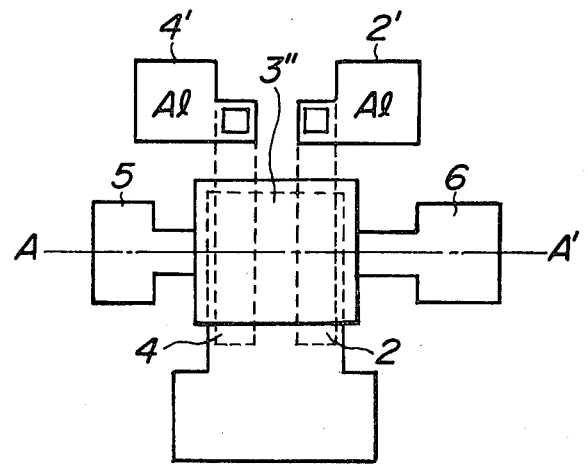
FIGS. 1(a), (b) and (c) are a plan view, a cross-sectional view and a circuit diagram showing respectively a basic structure and an equivalent circuit thereof of a preferred embodiment of the present invention.
Figure 1B:
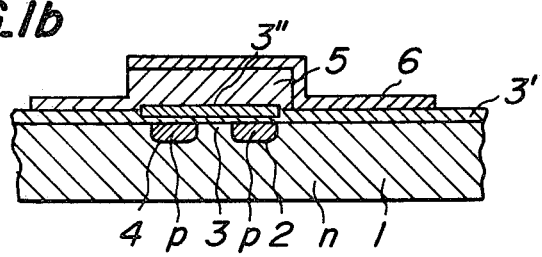
Figure 1C:
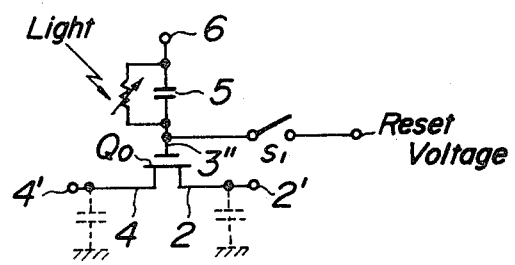

Firstly, the basic structure of the solid state photo-electric converting device according to the present invention is shown in FIGS. 1(a) and (b), and the equivalent circuit thereof is shown in FIG. 1(c).

In the solid state photo-electric converting device according to the present invention, the plan view of the basic structure of which is shown in FIG. 1(a) and the cross-sectional view thereof along the line A—A' is shown in FIG. 1(b), a signal voltage, which is generated with response to an amount of a light incoming into a photo-electric converting layer 5, which consists, for instance, of a photoconductive material, through a transparent electrode layer 6, is induced under the photo-electric converting layer 5, so as to affect a gate channel 3 of a p-channel FET $Q_0$, which is provided with a drain 2, a gate electrode 3" and a source 4 being disposed, for instance, on an n-type silicon substrate through an insulation thin layer 3' consisting, for instance, of silicon-oxide. In this structure, the signal voltage, the amount of which is varied with response to an input information represented by the variation of the amount of the incoming light, is applied to a gate electrode 3" of the FET $Q_0$ by connecting a drain 2 thereof with a voltage source through a resistor and connecting a source 4 thereof to the ground potential, so that an electric information signal formed of the variation of the current amplified on account of the field effect of the FET $Q_0$ can be derived from the drain 2 as an output of an imaging apparatus employing the above device for converting an incoming photo-image to a video-signal.

In the above case, the application of the signal voltage to the gate electrode 3" of the FET $Q_0$ can be effected also by the capacitive connection between a lower face of the photo-conductive layer 5 and an upper face of the gate electrode 3" through an insulation layer inserted between those faces, so as to isolate those faces from each other concerning the dc potential. So that such a benefit can be obtained that both of voltages impressed on the transparent electrode layer 6 of the photo-electric converting section and the electrodes of the amplifying section consisting of the FET $Q_0$ can be settled freely from each other.

After the electric information signal has been derived as mentioned above, a reset voltage is applied to the gate electrode 3" of the FET $Q_0$ by closing a reset switch $S_1$ in the equivalent circuit shown in FIG. 1(c), so that the signal voltage induced on the lower face of the photoconductive layer 5 with response to the amount of the light incoming thereinto through the transparent electrode layer 6, that is, the variation of potential caused with response to the amount of the incoming light, is eliminated at once, so as to reset the initial condition for the next time conversion.

By the way, in the structure shown in FIG. 1(a), two conductor layers, for instance, two aluminum layers 2' and 4' which are connected with two p-type diffusion layers connected respectively with the drain 2 and the source 4 shown by dotted lines in FIG. 1(a), are a drain electrode leading out terminal and a source electrode leading out terminal provided commonly for a group of those devices shown in FIG. 1(c).

In the solid state photo-electric converting device according to the present invention, having the basic structure shown in FIG. 1 and the behaviour as mentioned above, the signal voltage induced in the photo-electric converting layer 5 is not derived directly as an output signal thereof, but is applied directly to the amplifier FET $Q_0$ as a gate voltage, so as to be derived therefrom under the sufficient amplification, so that it is possible to obtain the output signal converted with the extremely high conversion efficiency in comparison with that of the conventional photo-diode.

That is, the amount of electric charge which can be derived from the conventional photo-electric converting device, for instance, the photo-diode, is reduced gradually from a starting point $t_1$ to an ending point $t_2$ of a certain time duration predetermined for the photo-electric conversion, because the electric charge is derived in a form of charging current derived from the converting device to a capacitor, and further it should be reduced completely to zero, in order to prevent the effect of the remaining electric charge to the succeeding process of repeated conversion. Accordingly, the gross amount $Q_A$ of the electric charge, which can be derived from the converting device at the predetermined time duration between those timing position $t_1$ and $t_2$, can be indicated by the following equation.

$$Q_A = \int_{t_1}^{t_2} I(t)$$

where I(t) is the output current of the conventional converting device which decreases gradually with the time.

In contrast therewith, in the photo-electric converting device according to the present invention, the constant amount of electric charge can be derived immutably during the above time duration between those timing positions $t_1$ and $t_2$ on account of the employment of the amplifier FET for amplifying the output current of the photo-electric converting element, so that the constant output current thereof $I_0$ can be realized and the following gross amount $Q_B$ of electric charge can be obtained.

$$Q_B = \int_{t_1}^{t_2} I_0 = I_0 \cdot (t_2 - t_1)$$

Moreover, although the conventional converting device is forced to reduce the output current to zero at the ending position $t_2$ of the time duration predetermined for the process of conversion as mentioned above, the resetting of the converting device according to the present invention can be carried out for eliminating the output current at an arbitrary timing because of the constancy thereof, so that, even if any high speed scanning is carried out on the converting device, for instance, according to a high resolution television system, the effect of the remaining electric charge can be prevented sufficiently from the succeeding process of repeated conversions.

Furthermore, the photo-electric converting layer 5 in the basic structure shown in FIG. 1 can be formed of any suitable material regardless of that of the substrate 1 and the silicon oxide-layer 3', although the same of the conventional converting device is restrict to a few kinds of material. Accordingly, it is possible according to the present invention that the excellent performance of spectral sensitivity can be attained by selecting the most suitable materials, for instance, chalcogenide Se-As-Te, antimony tri-sulphide $SbS_3$ and amorphous silicon for the photo-electric converting layer.

Figure 2A:
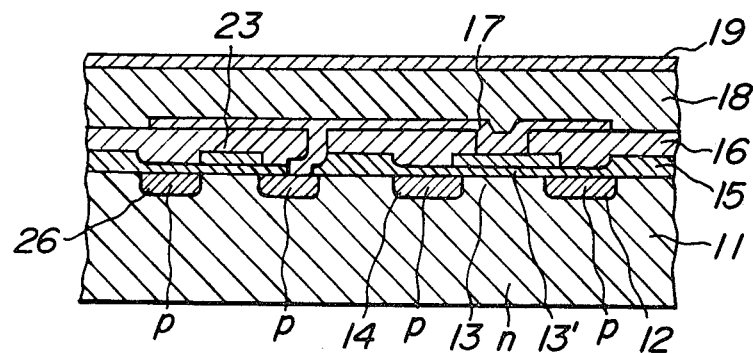
Figure 2B:
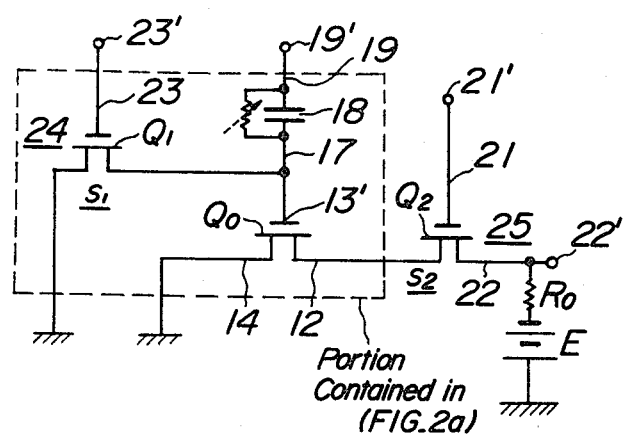

An example of the detailed structure of the photo-electric converting device according to the present invention, the basic structure of which is shown in FIG. 1, is shown in FIG. 2(a), and the equivalent circuit thereof is shown in FIG. 2(b).

In the solid state photo-electric converting device shown in FIG. 2(a), a drain 12, a gate channel 13 and a source 14 are formed in an n-type silicon substrate 11, and an ordinary gate electrode 13' and a newly provided conductive electrode 17 connected therewith are disposed opposite to the gate channel 13 through an insulation thin layer 15 formed, for instance, of silicon oxide-$SiO_2$, and further a photo-electric converting layer 18 consisting of a photo-conductive material is disposed on the conductive electrode 17 which is spreaded over the almost all area of the converting device. Another preferably opaque insulation layer 16 is provided between the aforesaid silicon-oxide layer 15 and the photo-electric converting layer 18 for insulating and separating those layers from each other and preferably shading between the upper photo-electric converter section and the lower amplifier section consisting of the p-channel FET. In this case, it is possible also to separate the gate electrode 13' and the conductive electrode 17 by inserting another insulation thin layer between them, so as to couple them through capacitance formed thereby between those electrodes for obtaining such benefits as the reduced injurious capacity and the easiness of manufacturing. That is, on account of the above insertion of those insulation layer 16 and the like, a stray capacity caused between the lower face of the photoconductive layer 18 and the electrodes 12, 14 and the substance 1 of the FET $Q_0$ can be decreased, so as to prevent the decrease of the induced signal voltage and the deterioration of the voltage to frequency characteristics thereof.

In the equivalent circuit shown in FIG. 2(b) the dotted-lined section of which corresponds to the detailed structure shown in FIG. 2(a) of the solid state photoelectric converting device according to the present invention, the gate electrode 13' of the FET $Q_0$ provided for amplifying the signal voltage induced in the photoconductive layer 18 is connected with a drain of an FET $Q_1$ 24 provided for resetting the amplifier FET $Q_0$ with a reset pulse applied thereto, and further the drain 12 of the amplifier FET $Q_0$ is connected with an FET $O_2$ 25, a gate electrode 21 of which is applied with a readout signal for reading out the output signal from the converting device dotted-lined in FIG. 2(b). The output signal appearing on a common load resistor $R_0$ can be derived from an output terminal 22'.

In the solid state photo-electric converting device formed as described above according to the present invention, in which the transparent electrode layder 19 and the drain 12 of the FET $Q_0$ are applied with appropriate dc voltages respectively, the signal voltage is induced on the lower face of the photo-conductive layer 18 with response to the amount of the light incoming into the photo-conductive layer 18 through the transparent electrode layer 19 from an object to be imaged, so as to be applied to the conductive electrode provided for collecting the whole signal charges induced on the whole lower face covering the area occupied by the converting device.

In the above-mentioned state of the converting device, when the reading-out pulse is applied to the gate electrode 21 of the read-out FET $Q_2$, the FET $Q_2$ becomes conductive, so that the amplifier FET $Q_0$ provided with the drain 12, the gate 13' and the source 14 can be actuated so as to let a signal current flow through those FET $Q_0$ and $Q_1$, the amount of which current corresponds to the aforesaid signal voltage applied to the gate electrode 13' from the lower face of the photoconductive layer 18 through the collecting conductive electrode 17. So that, the output signal voltage caused on the load resistor $R_0$ by the above signal current can be derived from the output terminal 22'. Thereafter, the reset FET $Q_1$ becomes conductive with response to the reset pulse applied to the gate electrode 23 of the reset FET $Q_1$, so as to ground the gate electrode 13' and the conductive electrode 17 connected therewith for resetting the amplifier FET $Q_0$, in order to repeat the above process for reading out the output signal, the voltage of which is extremely higher than that of the conventional converting device.

In the above mentioned detailed structure of the converting device, the reset FET $Q_1$ is used for resetting the initial state of the device. However, it is possible also to employ a resistive element in place thereof as a simple means for discharging the electric charge induced on the lower face of the photoconductive layer 18 therethrough.

In the detailed structure of the converting device as shown in FIGS. 2(a) and (b), the signal charge or the signal voltage induced with response to the amount of the incoming light is not derived directly from the photo-electric converting layer, but derived through the amplifier FET provided for the amplification thereof with the extremely high conversion efficiency and the sufficiently high output signal level.

Moreover, it is possible according to the above mentioned structure to amplify the signal voltage with an extremely high gain based on the remarkably reduced input capacity of the amplifier FET $Q_0$ coupled directly with the photoconductive layer 18 in comparison with an FET amplifier arranged ordinarily outside the photo-electric converting device, so that an extremely large signal current can be derived from the amplifier FET $Q_0$ the gate of which is controlled by an induced minute signal charge.

In addition thereto, as shown in FIG. 2(a), the whole signal charges induced in the whole area of the lower face of the photoconductive layer can be derived and amplified concentratedly by virtue of the conductive electrode layer covering the whole area thereof, so that the extremely high conversion efficiency can be realized easily with an excellent signal to noise ratio under the effective usage of the whole area of the light receiving face of the converting device, which face is allocated respectively to every unit picture elements of the target in the imaging device.

Furthermore, the above mentioned detailed structure of the solid state photo-electric converting device can be manufactured comparatively easily by stacking respective layers efficiently, regardless of a little complexity thereof.

Figure 3A:
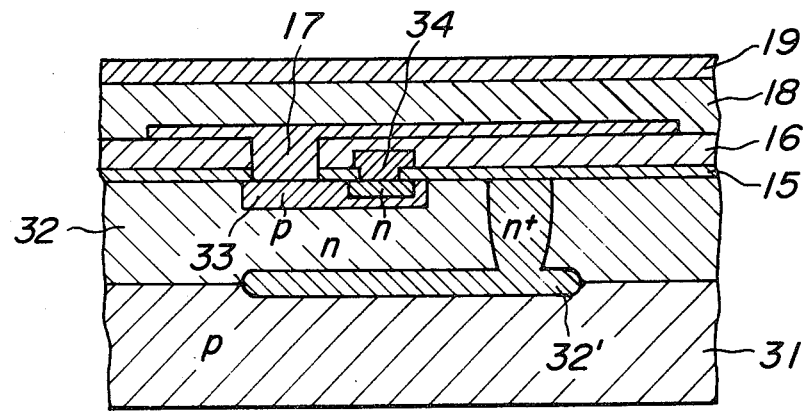
Figure 3B:
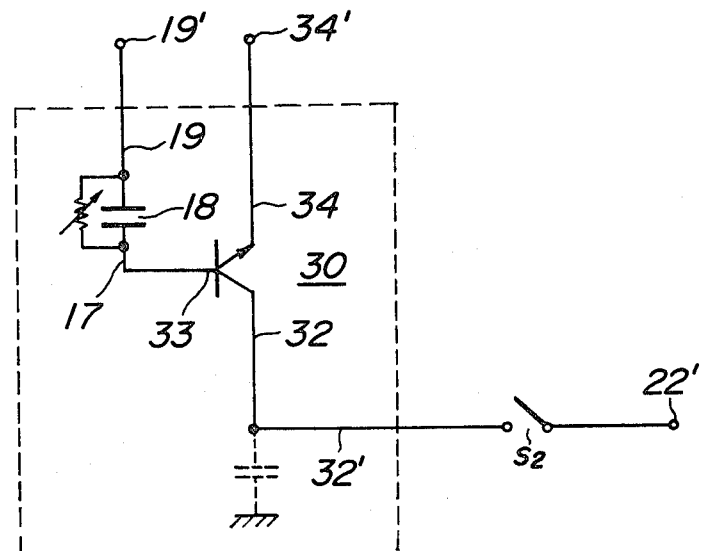

Another basic structure of the solid state photoelectric converting device according to the present invention, in which the amplifier FET as shown in FIG. 1(b) is replaced with a bipolar transistor amplifier, is shown in FIG. 3(a), and the equivalent circuit thereof is shown in FIG. 3(b).

In the basic structure shown in FIG. 3(a), the silicon-oxide layer 15, the insulation layer 16, the photoconductive layer 18 and the transparent electrode layer 19 are provided similarly as shown in FIGS. 1(b) and 2(a). However, a bipolar transistor 30 is employed in place of the FET $Q_0$ shown in those drawings, which transistor consists of a collector 32 formed of n-type silicon, a base 33 formed of p-type silicon and an emitter 34 formed of n-type silicon.

In the above structure of the converting device, the signal charge induced on the lower face of the photoconductive layer 18 with response to the amount of the light incoming thereinto is applied to the base 33 of the bipolar transistor 30. An emitter electrode terminal 34' connected with the emitter 34 of the transistor 30 is applied with an appropriate source voltage responding to the voltage impressed on the base 33 thereof so as to obtain an adequate base current, and further a stray capacity formed on the collector 32 thereof is charged in such a state by applying a source voltage from an output terminal 22' through a closed switch $S_2$ that the collector 32 is impressed with a dc voltage being sufficiently higher than those of both of the base 33 and the emitter 34. Accordingly, the variation of the base current is caused with response to the amount of the incoming light by the signal charge converted from the incoming light in the photoconductive layer 18, so that the variation of the collector current, which is $\beta$ times as much as that of the base current, which $\beta$ is the current amplification factor, is caused, and, as a result thereof, the rate of decrease of the electric charge stored in the above stray capacity is varied with the above variation of the collector current. Consequently, in case the switch $S_2$ is closed for a short time duration at a certain interval, the variation of the charging current flowing to the stray capacity from the output terminal 22' through the closed switch $S_2$ corresponds to the amount of the light incoming during the above mentioned certain interval and is amplified by the transistor 30, so that the amount of the incoming light can be converted with a high conversion efficiency by the above mentioned procedure.

According to the above mentioned detailed structure, the spectral sensitivity performance of the converting device depends mainly to the property of the photoconductive layer 18 also, so that an excellent spectral sensitivity performance can be realized by selecting a suitable material for the photoconductive layer 18.

Moreover, according to the above structure, the signal charge induced in the photoconductive layer 18 with response to the incoming light flows out so as to form the base current of the transistor 30, so that such a resetting means for resetting the signal charge as the reset FET employed in the detailed structure shown in FIG. 2(a) comprising the amplifier FET is not required at all, so as to attain the extreme simplification of the structure of the solid state photo-electric converting device according to the present invention.

Figure 4A:
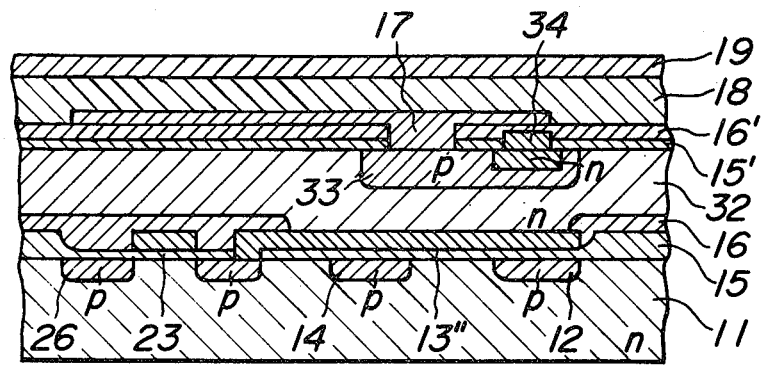

A detailed example of the basic structure employing the bipolar transistor amplifier as shown in FIGS. 3(a) and (b) is shown in FIGS. 4(a) and (b), the former thereof showing the detailed structure and the latter showing the equivalent circuit thereof.

Figure 4B:
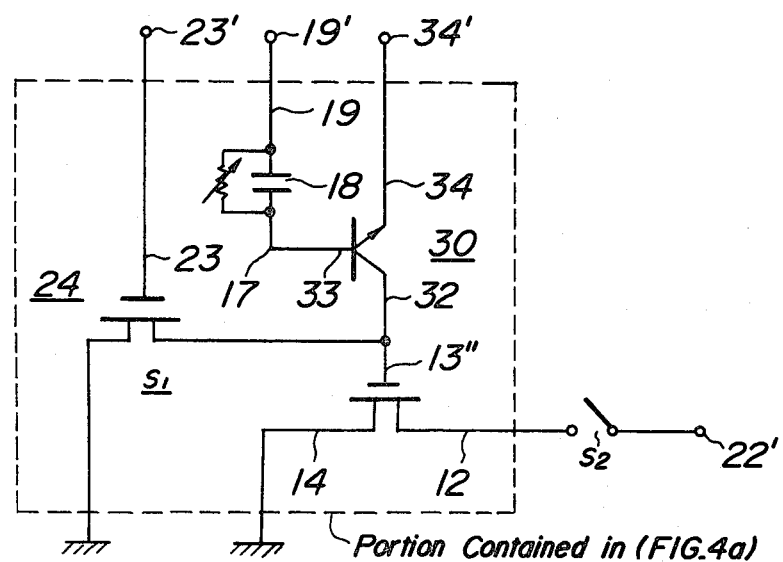

In the detailed structure shown in FIG. 4(a), besides a similar bipolar transistor amplifier as that in the basic structure shown in FIG. 3(a), an amplifier FET consisting a drain 12, a source 14 and a gate 13" and a reset FET 24 connected with a reset terminal 23 and serving as the reset switch $S_1$ are provided under the n-type silicon-oxide layer 15' formed as the collector 32 of the transistor 30, those elements being connected with each other as shown in FIG. 4(b).

In the detailed structure shown in FIG. 4(a), the behaviour and the operation of the stray capacity caused on the collector 32 of the transistor 30 and the switch $S_2$ are similar as described above by referring to FIGS. 3(a) and (b).

However, the rate of the decrease of the electric charge stored in the stray capacity previously with response to the variation of the collector current is applied to the gate electrode 13" of the amplifier FET as the variation of a voltage applied thereon, so as to obtain the amplified signal voltage at the output terminal 22'.

In other words, in the detailed structure shown in FIGS. 3(a) and (b), the switch $S_2$ serves for deriving the output signal and resetting the converting device, whilst, in the detailed structure shown in FIGS. 4(a) and (b), the switch $S_1$ consisting of the FET 24 serves for charging the stray capacity formed on the collector 32 of the bipolar transistor 30 so as to reset the converting device, the output signal derived from the bipolar transistor 30 being taken out through the amplifier FET and the switch $S_2$.

In case the amount of the incoming light is minute and accordingly the signal charge induced in the photoconductive layer 18 is minute also, the transistor 30 is forced to operate in an extremely small range of the base current thereof. Generally speaking, the current amplification factor $\beta$ of the bipolar transistor becomes small in the small range of the base current thereof, so that, in the above case, it is feared that the sufficient amplification cannot be effected by the transistor 30.

For the above reason, the detailed structure shown in FIG. 4(a) further comprises the amplifier FET besides the bipolar transistor amplifier 30, so as to attain a sufficiently high amplification factor on account of the combination of those transistor amplifiers for realizing the desired photo-electric converting device having the extremely high conversion efficiency.

Moreover, according to the detailed structure shown in FIGS. 4(a) and (b), an excellent spectral sensitivity performance can be obtained by selecting a suitable material for the photoconductive layer similarly as described above by referring to FIGS. 2(a), (b) and 3(a), (b).

Figure 5A:
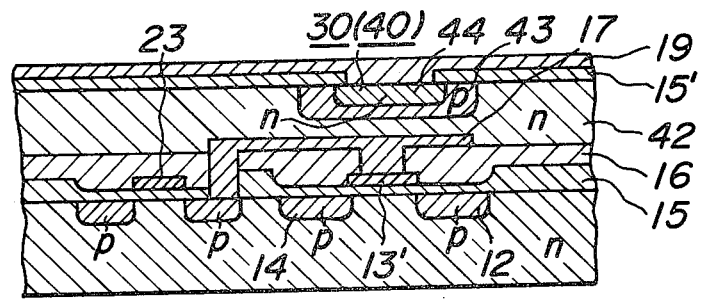
Figure 5B:
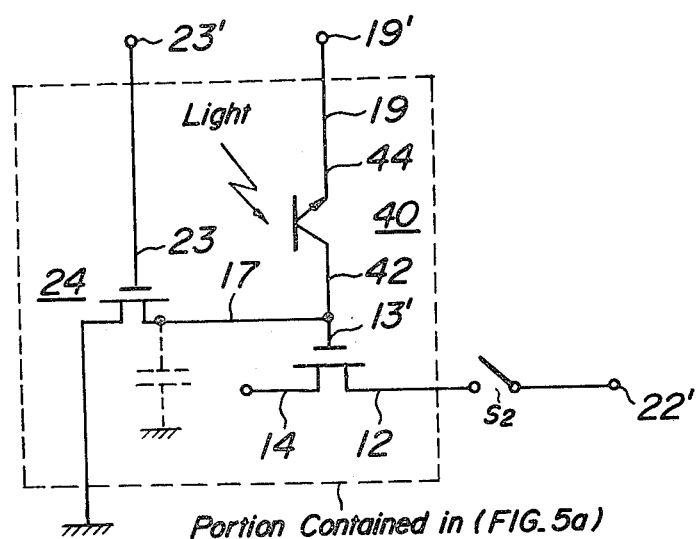

Another detailed example of the basic structure employing the bipolar transistor amplifier as shown in FIGS. 3(a) and (b) is shown in FIGS. 5(a) and (b), the former thereof showing the detailed structure and the latter showing the equivalent circuit thereof.

In the detailed structure shown in FIG. 5(a), the photoconductive layer 18 comprised in the detailed structure shown in FIG. 4(a) is omitted, whilst a bipolar transistor consisting of a collector 42, a base 43 and an emitter 44 serves as both of a transistor amplifier 30 and a photo-transistor 40.

In case the above transistor serves as the photo-transistor 40, pairs of electron and hole can be generated with response to the light incoming into the domain of the base 43, and then the base current corresponding to those generated pairs is amplified by the bipolar transistor itself serving as the transistor amplifier 30, so as to cause the variation of the collector current with response to the incoming light. The succeeding operation of the converting device shown in FIG. 5(a) is similar to that of the detailed structure shown in FIG. 4(a). That is, the output signal voltage amplified by the FET consisting of the drain 12, the gate 13' and the source 14 can be obtained at the output terminal 22'.

In the above mentioned detailed structure shown in FIGS. 5(a) and (b), on account of the omission of the photoconductive layer proper, the structure of the converting device can be simplified remarkably and the manufacture thereof can be facilitated notably.

On the other hand, the spectral sensitivity performance of the above detailed structure of the converting device depends on the material used for forming the photo-transistor 40, that is, the amplifier transistor 30, so that the above detailed structure has such a defect that the uniform spectral sensitivity performance can be hardly attained in the desired range of the spectrum. Accordingly, the above detailed structure of the converting device can be employed for the restricted use for which the excellency of the spectral sensitivity performance of the device is not required.

Figure 6A:
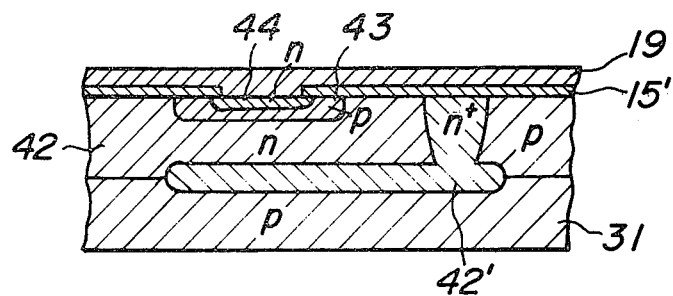
Figure 6B:
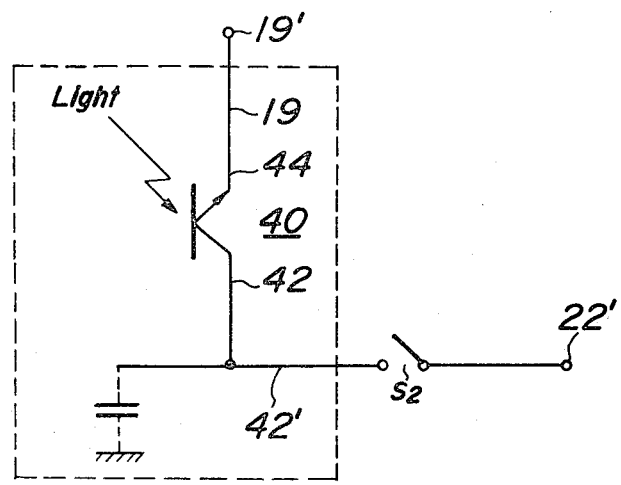

A further simplified modification of the detailed structure shown in FIGS. 5(a) and (b) is shown in FIGS. 6(a) and (b), the former showing the detailed structure and the latter showing the equivalent circuit thereof.

In the detailed structure shown in FIG. 6(a), the amplifier FET and the reset FET, which are comprised in the detailed structure shown in FIG. 5(a) are further omitted, so that only the photo-transistor 40 serves for both of photo-electric conversion and amplification.

As mentioned earlier, the current amplification factor of the photo-transistor depends on the base current thereof. However, in case the amount of the incoming light is comparatively large and accordingly the base current on which the amplification factor depends exceeds a certain predetermined value, the above detailed structure of the converting device is fairly effective because of the high conversion efficiency, the simplicity of structure and the easiness of manufacture.

As mentioned earlier also, the subsidiary object of the present invention is to realize a solid state imaging apparatus provided with a matrix of the aforesaid solid state photo-electric converting devices having a high conversion efficiency and further an excellent spectral sensitivity performance.

Various kinds of structures and configurations of the solid state imaging apparatus has been disclosed, some of which has been employed for the practical use. One of those structures, which has a close relation to that of the present invention because of the matrix distribution of photo-electric converting elements the conversion outputs of which are derived therefrom selectively according to the operation of the electronic switch, will be explained as follows.

In the conventional solid state imaging apparatus, two kinds of solid state imaging device formed of either unitary dimensional arrangement or two dimensional arrangement of photo-electric converting elements are employed.

Out of those two kinds of imaging device, the two dimensional arrangement of the converting elements will be described as an example thereof hereinafter by referring to FIG. 7, which shows a basic construction of a so-called X-Y address-type solid state imaging apparatus, and FIGS. 8(a) and (b), which show respectively a cross-sectional structure and an equivalent circuit of a conventional solid state photo-electric converting device consisting of a converting element and a switching element thereof as a picture element of the imaging plate.

In the basic structure of the solid state imaging plate shown in FIG. 7, a matrix of plural solid state photo-electric converting elements is arranged on respective cross-points between plural rows and plural columns is scanned sequentially in the vertical direction at every rows by a Y-scan driving circuit 52, each row thereof being scanned sequentially in the horizontal direction at every columns by a X-scan driving circuit 51, so as to derive an output picture signal generated thereby from an output terminal through an amplifier 53. Accordingly, until a minute amount of signal charge induced in the solid state photo-electric converting element reaches to the amplifier 53, which is arranged customarily outsides the imaging plate, in the above process of scanning, a remarkable deterioration of the signal to noise ratio thereof cannot help being caused by a large capacity formed on a selected signal lead which is connected commonly with plural converting elements, a switching noise generated by the switching operation effected in the X-scan driving circuit 51 and others.

In other words, the solid state photo-electric converting device shown in FIGS. 8(a) and (b) and forming the conventional solid state imaging plate comprises a photo-diode consisting of a p-type domain 4 and an n-type substrate 1, and a p-channel-type MOS FET $Q_2$ consisting of the p-type domain 4 as a source thereof, a gate 13' and a drain 2, used for deriving the signal charge induced in the photo-diode, so as to generate an output signal at a load resistor $R_0$ connected with the p-type drain 2 of the deriving FET with response to the amount of the light incoming into the photo-diode D as shown in FIG. 8(a) and to derive the above output signal through a switching FET $Q_2$ for the Y-scanning and another switching FET $Q_3$ for the X-scanning as a sequential output picture signal generated at every picture element. So that, the minute amount of signal charge, which can be amplified scarcely after generated in the photo-diode D, is derived through those switching FET's with a poor conversion gain of the photo-diode and the aforesaid deteriorated signal to noise ratio.

In contrast therewith, the solid state photo-electric converting device according to the present invention, which consists of the direct combination of the photo-electric converting element and the amplifier FET belonging thereto, possesses the extremely excellent performance of the photo-electric conversion, that is, the extremely high conversion gain and the extremely high signal to noise ratio.

Particularly, the above mentioned extremely high signal to noise ratio will be described in more detail hereinafter.

As mentioned earlier, in the solid state imaging apparatus formed of a matrix of plural solid state photo-electric converting devices, the signal charge induced in the converting device cannot help being attenuated by the large capacity formed on the output lead and added with switching noises caused by the X-scan driving circuit.

Accordingly, when output signals derived originally from the conventional converting device and that of the present invention are denoted by $S_1$ and $S_2$ respectively, output signals derived finally from the conventional imaging apparatus and that of the present invention are denoted by $S'_1$ and $S'_2$ respectively and noises added to those original signal outputs $S_1$ and $S_2$ are denoted by $N'_1$ and $N'_2$, and the attenuation factor of those original output signals $S_1$, $S_2$ is denoted by K, the following equations can be obtained.

$$S'_1 = S_1 - KS_1$$

$$S'_2 = S_2 - KS_2$$

Besides, according to the above explanation of the converting devices, the other equation can be obtained as follows.

$$S_2 = 100 \times S_1$$

On the other hand, according to the conventional imaging apparatus, the signal to noise ratio of about 40 dB can be obtained practically, so that the above mentioned noise $N'_1$ can be represented by the following equations.

$$20 \log \frac{S'_1}{N'_1} = 40$$

$$\text{i.e. } N'_1 = \frac{S'_1}{100} = \frac{(1-K)S_1}{100}$$

The amount of noise represented by the above equation is substantially equal to that in the imaging apparatus of the present invention. Accordingly, the signal to noise ratio obtained in the latter can be represented by the following equation.

$$\frac{S'_2}{N'_2} = \frac{S'_2}{N'_1} = \frac{(1-K)S_2}{N'_1} = \frac{100 \times (1-K)S_1}{N'_1} = 100 \frac{S'_1}{N'_1}$$

$$\text{i.e. } 20 \log \frac{S'_2}{N'_2} = 20 \log \left( 100 \cdot \frac{S'_1}{N'_1} \right) = 80 \, dB$$

Apparently from the above equation, according to the present invention, it is possible to obtain the output signal having the extremely high signal to noise ratio in comparison with that of the conventional converting device.

Moreover, the aforesaid stray capacity accompanying with the X-scanning can be decreased remarkably by arranging the imaging plate as shown later in FIGS. 13 and 18, so that it is possible also according to the present invention to realize a further improved signal to noise ratio being remarkably higher than that mentioned above.

In the next place, several examples of the two dimensional solid state imaging apparatus comprising the matrix of the aforesaid photo-electric converting devices employing an n-channel-type FET as the solid state amplifier accompanied therewith according to the present invention will be explained in detail hereinafter.

Figure 9:
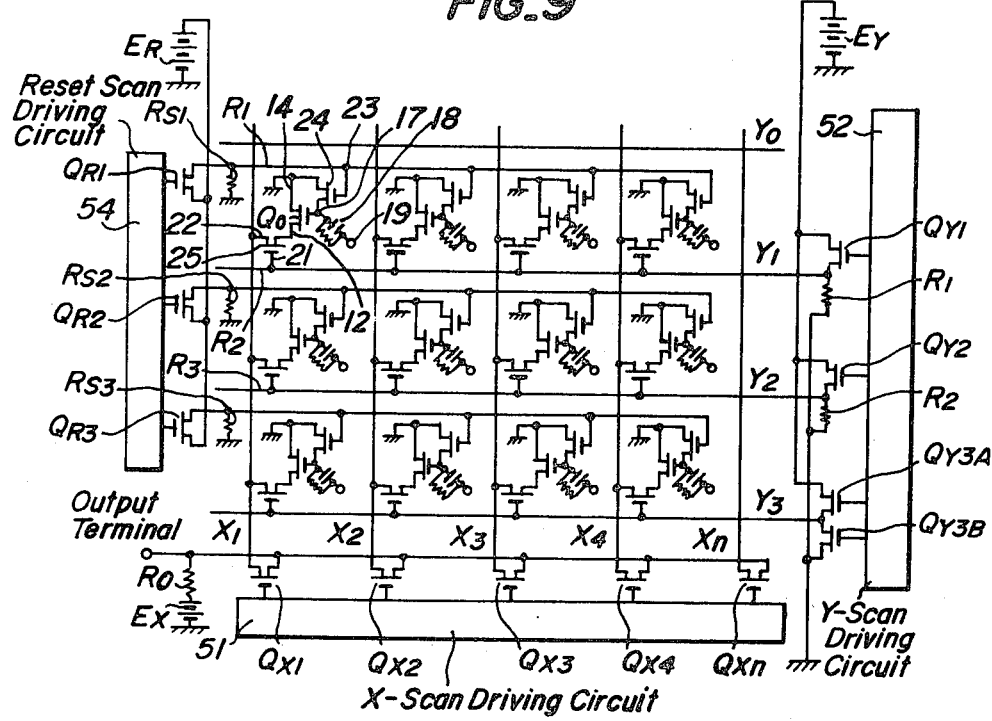

In an imaging apparatus shown in FIG. 9, plural converting devices arranged as shown in FIG. 2(b) are further arranged in a matrix thereof as a unit imaging picture element, together with an X-scan driving circuit 51 formed of a shiftregister and the like for generating a horizontal scanning pulse train repeatedly at the television horizontal scanning intervals, a Y-scan driving circuit 52 formed of a shiftregister and the like for generating a vertical and the like for generating a vertical scanning pulse train repeatedly at the television vertical scanning intervals and a reset scan driving circuit 54 formed of a shiftregister and the like for generating a resetting pulse train repeatedly at the television vertical scanning intervals.

In the matrix of the converting devices, the drains 22 of the FET's 25 comprised in the equivalent circuit shown in FIG. 2(b) of the respective converting devices are connected commonly with X-scan switching FET's $Q_{X1}$, $Q_{X2}$, $Q_{X3}$ and so on respectively at every columns of the matrix, which switching FET's are driven sequentially by the X-scan pulses derived from the X-scan driving circuit 51 at the repetition rate being equal to the pitch of the picture elements, so as to conduct elemental picture signals to an output terminal to every columns sequentially in the X direction, that is, in the horizontal direction.

On the other hand, the source 14 of the amplifier FET's $Q_0$ and the sources of the reset FET's 24 are grounded, and further the gates 21 of the readout FET's 25 are connected commonly with Y scan switching FET's $Q_{Y1}$, $Q_{Y2}$, $Q_{Y3}$ and so on respectively at every rows of the matrix, which switching FET's are driven sequentially by the Y-scan pulses derived from the Y-scan driving circuit 52 at the repetition rate being equal to the television horizontal scanning interval, so as to switch the source voltage $E_Y$ at the horizontal scanning interval, which voltage is applied to the gates 21 of the readout FET's 25 commonly at every rows and as a result thereof to conduct the elemental picture signals to the output terminal at every rows sequentially in the Y direction, that is, in the vertical direction.

Furthermore, the gates 23 of the reset FET's 24 are connected commonly with reset scan switching FET's $Q_{R1}$, $Q_{R2}$, $Q_{R3}$ and so on respectively at every rows of the matrix, which switching FET's are driven sequentially by the reset scan pulses derived from the reset scan driving circuit 54 at the repetition rate being equal to the television horizontal scanning interval, so as to switch the reset source voltage $E_R$ at the horizontal interval, which voltage is applied to the gates 23 of the reset FET's 24 commonly at every rows and as a result thereof to reset the potential of the gate electrode 13' of the amplifier FET $Q_0$ to the ground potential through the substrate, so that the elemental converting devices are reset by the application of the reset source voltage $E_R$ for a certain time duration immediately after the elemental picture signals are readout sequentially, so as to prepare the succeeding storage of the induced signal changes.

By the way, the numbers of the aforesaid respective kinds of switching FET's correspond naturally to the number of rows or columns of the matrix in which the elemental converting devices are arranged.

In the next place, the behaviour or the operation of the above mentioned solid state imaging apparatus will be explained with regard to the sequential time points $t_1$, $t_2$, ..., $t_{n+1}$, ..., $t_{2n+1}$, which have the interval therebetween being equal to the clock period corresponding to the pitch of the picture elements.

At the starting point $t_1$ of the X-Y scanning of one frame of the television picture, only the X-scan switching FET $Q_{X1}$ and Y-scan switching FET $Q_{Y1}$ are conductive, whilst all of the remaining switching FET's are cut off. Accordingly, the gates 21 of the readout FET's 25 connected commonly with the horizontal lead $Y_1$ of the first row are impressed commonly with the readout source voltage $E_Y$ through the lead $Y_1$, so as to make those readout FET's 25 conductive, whilst the sources 14 of the amplifier FET's $Q_0$ of the elemental converting devices belonging to the first column of the matrix can be connected commonly with the vertical lead $X_1$ through the readout FET's 25 belonging thereto respectively.

On the other hand, all of the transparent electrodes 19 of the respective elemental converting elements are applied always commonly with an appropriate dc voltage, so as to actuate all of the respective converting devices, so that the elemental signal charges induced with response to the amount of the incoming light are always applied to all of the gate electrodes 13' of the amplifier FET's $Q_0$ through the collecting electrodes 17 respectively. Consequently, in all of the elemental converting devices arranged in the matrix, the signal charge are always accumulated except for the time duration of reset.

At the starting point $t_1$ of the XY scanning, as mentioned above, only the X-scan switching FET $Q_{X1}$ and the Y-scan switching FET $Q_{Y1}$ are conductive, so that only the vertical lead $X_1$ of the first column is impressed with the signal source voltage Ex as well as only the horizontal lead $Y_1$ of the first row is impressed with the readout source voltage $E_y$. Consequently, at the starting point $t_1$, the elemental converting device disposed at the upper left corner of the matrix, belonging to the first column and the first row of the matrix only is operated as a whole, so as to actuate the amplifier FET $Q_0$ thereof for deriving the signal charge stored on the gate electrode 13' thereof in a form of imaging output signal voltage to be readout from the output terminal through the vertical lead $X_1$ and the X-scan driving FET $Q_{X1}$.

At the next point $t_2$ succeeding to the starting point $t_1$ of the XY scanning, the Y-scan switching FET $Q_{Y1}$ continues to be conductive, whilst the X-scan switching FET $Q_{X2}$ is conductive in place of the FET $Q_{X1}$ regarding the horizontal X direction. Accordingly, at the time point $t_2$, the second elemental converting device in the upper row belonging to the first row $Y_1$ and the second column $X_2$ only is operated as a whole, so as to derive the elemental picture signal voltage to be readout from the output terminal.

At the time point $t_{n+1}$ at which all of the elemental converting devices belonging to the first row $Y_1$ have been actuated sequentially as mentioned above, so as to readout the elemental picture signal voltages sequentially, only the X-scan switching FET $Q_{X1}$ and the Y-scan switching FET $Q_{Y2}$ are conductive, so that, similarly as mentioned above regarding the first row $Y_1$, all of the elemental converting devices belonging to the second row $Y_2$ are actuated sequentially from the left end to the right end thereof, so as to derive the elemental picture signals therefrom sequentially. In case the number of leads in the vertical direction, that is, the number of the columns of the matrix is assumed to be n, which n is equal to four in the imaging apparatus shown in FIG. 9, at the time point $t_{n+1}$, the horizontal scanning of the elemental converting devices belonging to the second row $Y_2$ is started as well as the reset scan switching FET $Q_{R1}$ becomes conductive with response to the impression of the reset pulse derived from the reset scan driving circuit 54, so that all of the gate electrodes 23 of the reset FET's 24 consisting in the elemental converting devices belonging to the first row, from which the elemental picture signals have been derived, are impressed commonly with the reset source voltage $E_R$, so as to make those reset FET's 24 conductive. As a result thereof, the remaining signal charges stored on the collecting electrodes of those elemental converting devices are released to the ground through those reset FET's 24, so as to reset the elemental converting devices belonging to the row from which the elemental picture signals have been derived already all at once.

At the time point $t_{2n+1}$, when the horizontal scanning of the second row has been carried out as mentioned above, the Y-scan switching FET $Q_{Y2A}$, the X-scan switching FET $Q_{X1}$ and the reset switching FET $Q_{R2}$ become conductive, the horizontal scanning of the elemental converting devices belonging to the last row $Y_m$, which $Y_m$ is assumed to be $Y_3$ for the convenience of the explanation in FIG. 9, is started as well as the reset of the elemental converting devices belonging to the preceding row $Y_{m-1}$, that is, $Y_2$ in FIG. 9 is carried out. By the way, in case the resistors $R_1$, $R_2$ provided for releasing the signal charges remaining after the readout thereof are replaced with FET's similarly as the FET $Q_{Y3B}$ provided for the last row $Y_3$, the release of the remaining signal charges is effected rapidly, so that the high speed scanning of the imaging apparatus can be realized.

Figure 10:
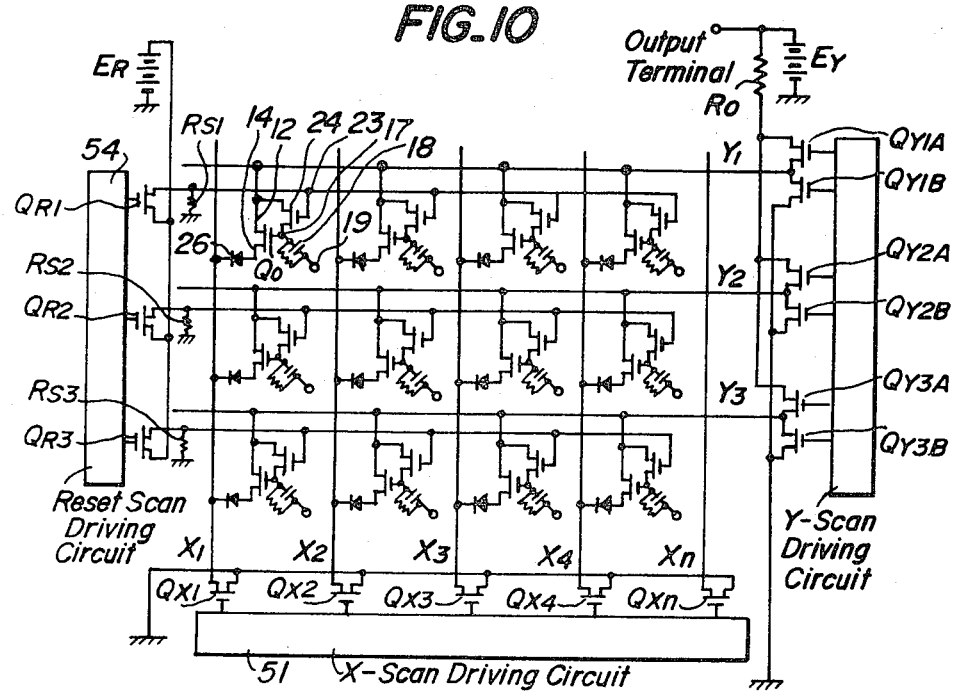

In the next place, another example of the solid state imaging apparatus employing elemental converting devices according to the present invention as shown in FIG. 10 is arranged similarly as that shown in FIG. 9, except for the following modifications.

In the solid state imaging apparatus shown in FIG. 10, the read-out FET $Q_1$ namely 25 employed in the equivalent circuit of the elemental converting device as shown in FIG. 4(b) is replaced with a diode 26 provided for preventing the inverse flow of the picture signal, the horizontal lead Y, which is connected respectively with the gate electrode 21 of the readout FET 25 in FIG. 9, being connected commonly with the drain 24 of the amplifier FET $Q_0$ and the drain of the reset FET 24, and further the signal voltage source Ex and the load resistor $R_0$ accompanied with the X-scan switching FET's $Q_X$ are replaced with the signal voltage source $E_y$, which serves also as the readout voltage source, and the load resistor $R_0$ accompanied with the Y-scan switching FET's $Q_Y$, whilst the sources of the X-scan switching FET's $Q_X$ are ground commonly. In addition thereto, the aforesaid resistors R provided for releasing the remaining signal charges in FIG. 9 are replaced with FET's $Q_{Y0B}$ to $Q_{Y3B}$, so as to effect the rapid release of the remaining signal charges.

Figure 11:
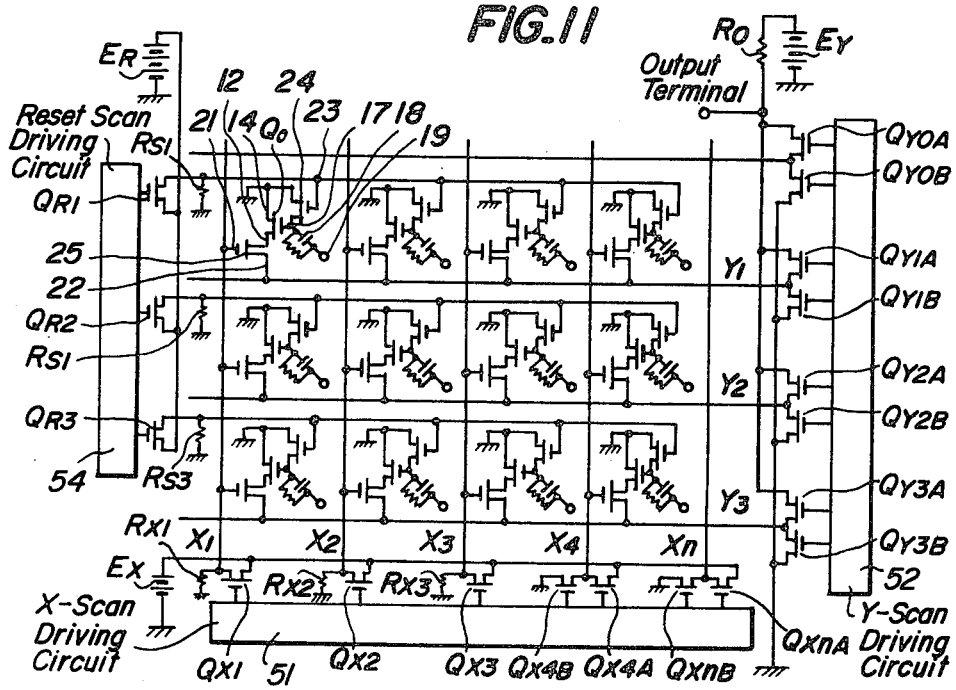

In the next place, still another example of the solid state imaging apparatus employing elemental converting devices according to the present invention as shown in FIG. 11 is arranged also similarly as that shown in FIG. 9, except for the following modifications.

In the solid state imaging apparatus shown in FIG. 11, the readout source voltage $E_Y$ and the signal source voltage $E_X$, which are impressed respectively on the gate 21 and the drain 22 of the readout FET 25 in FIG. 9, are impressed respectively on the drain 22 and the gate 21 thereof oppositely, and the load resistor $R_0$, on which the output picture signal should be generated, is inserted into the path for impressing the readout source voltage $E_Y$ on the drain 22 of the readout FET 25.

By the way, the resistors $R_x$ connected respectively with the X-scan switching FET's $Q_x$ for releasing the remaining signal charges can be replaced with FET's similarly as the FET $Q_{XnB}$ connected with the last X-scan switching FET $Q_{XnA}$, so as to attain the rapid operation of the imaging apparatus.

Figure 12:
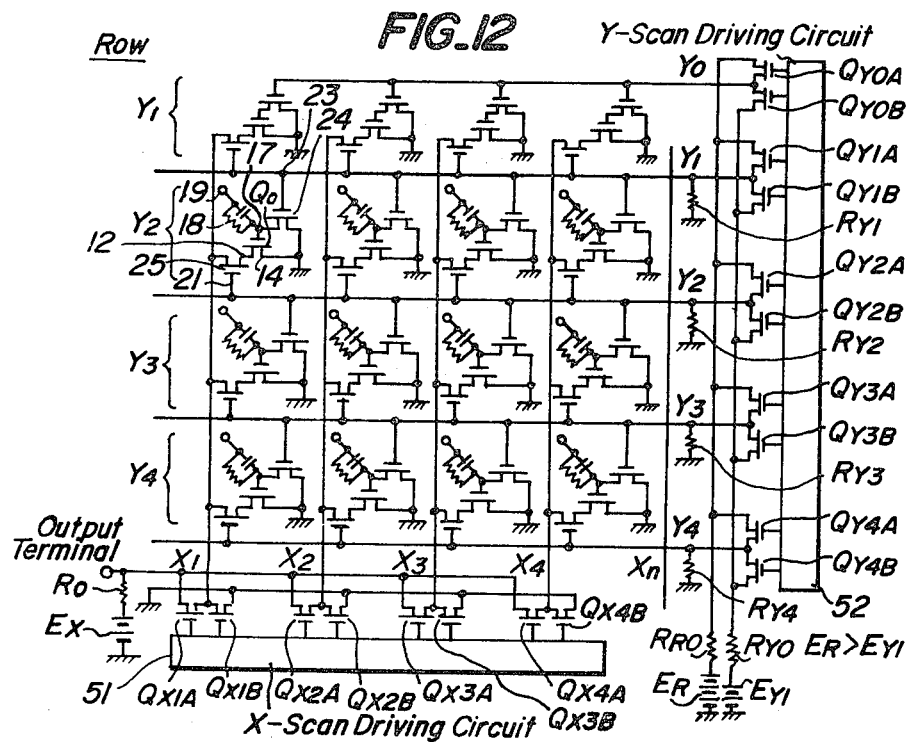

In further another example of the solid state imaging apparatus employing elemental converting devices according to the present invention as shown in FIG. 12, the horizontal leads $Y_1$ to $Y_m$ provided for impressing the readout source voltage $E_y$ on the elemental converting devices serve also as those provided for impressing the reset source voltage $E_R$ on those devices in place of the horizontal leads $R_1$ to $R_m$ in FIG. 9. That is, the horizontal leads $Y_1$, $Y_2$ and $Y_3$ are connected respectively with the gates 23 of the reset FET's 24 of the elemental converting devices belonging to the preceding row and the gates 21 of the readout FET's 25 of the elemental converting devices belonging to the succeeding row, and further the voltages are settled to be quite different between the readout voltage source $E_Y$ and the reset voltage source $E_R$, so as to enable the exact distribution of those voltage sources based on the difference of the threshold levels of the gate voltages between the readout FET 25 and the reset FET 24. For instance, when the elemental converting devices belonging to the second row $Y_2$ are scanned in the horizontal direction, the Y-scan switching FET $Q_{Y2B}$ is made conductive, so as to apply the readout source voltage $E_y$ to the gates 21 of the readout FET 25 of those converting devices belonging to the second row $Y_2$, as well as the Y-scan switching FET $Q_{Y0A}$ is made conductive also, so as to apply the reset source voltage $E_R$ which is settled higher than the readout source voltage $E_Y$ to the gates 23 of the FET's 24 of the elemental converting devices belonging to the first row $Y_1$ for the simultaneous reset thereof.

By the way, the solid state imaging apparatus shown in FIG. 12 is arranged also similarly as that shown in FIG. 9 except for the above and following modifications.

That is, the X-scan switching FET's $Q_x$ for connecting the vertical leads $X_1$, $X_2$, $X_3$ and so on with the output terminal sequentially are formed of pairs of X scan switching FET's $Q_{XnA}$ and $Q_{XnB}$, so as to ascertain the rapid X scan switching operations.

Figure 13:
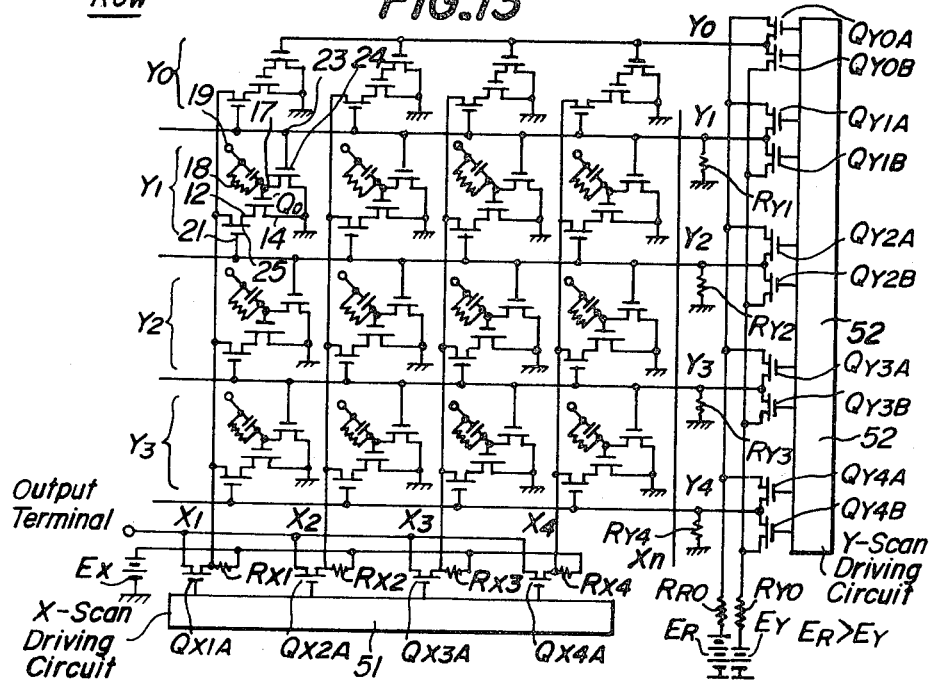

In the next place, further another example of the solid state imaging apparatus employing elemental converting devices according to the present invention as shown in FIG. 13 is arranged also similarly as that shown in FIG. 9, except for the following modification of the X scan switching.

That is, the vartical leads X in the imaging apparatus shown in FIG. 13 are applied always with the signal source voltage $E_x$ through the resistors $R_X$, on which resistors are impressed sequentially portions of the elemental picture signal voltages derived from the elemental converting devices belonging to the respective rows applied with the readout source voltage $E_Y$ sequentially by the Y scan switching, which portions appear on the resistors $R_x$ of the series connection of those resistors $R_x$, the inner resistances of the readout FET's 25 and the inner resistances of the amplifier FET's $Q_o$ and are derived sequentially through the X scan switching FET's $Q_{xA}$ to the output terminal, so as to ascertain the rapid read-out of the output picture signal.

Figure 14:
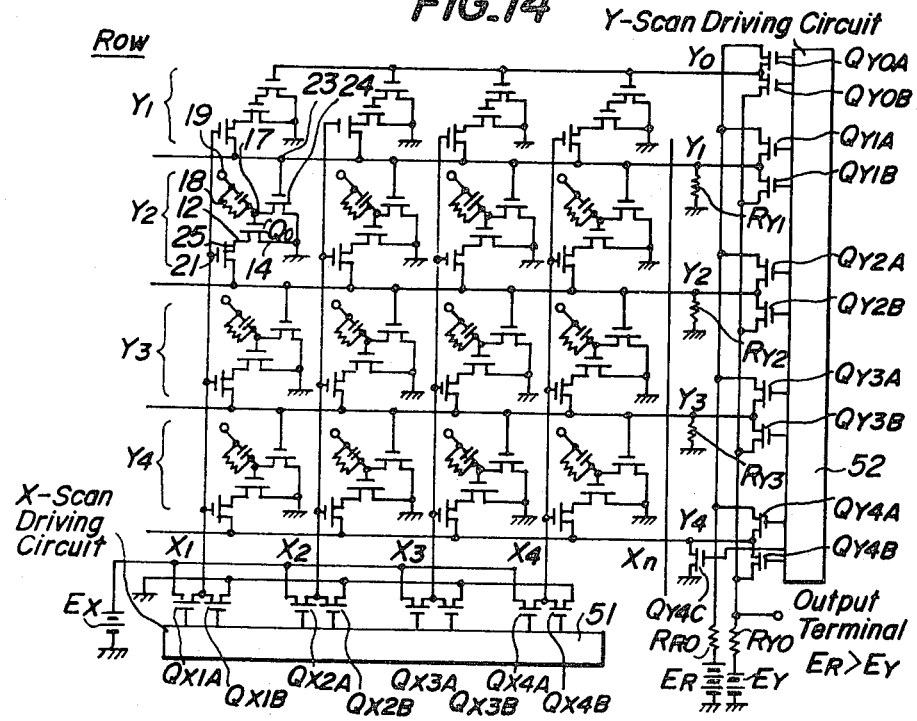

In the next place, further another example of the solid state imaging apparatus employing elemental converting devices according to the present invention as shown in FIG. 14 is arranged similarly as that shown in FIG. 12, except for the following modifications.

In the solid state imaging apparatus shown in FIG. 14, the readout source voltage $E_Y$ and the signal source voltage $E_x$, which are impressed respectively on the gate 21 and the drain 22 of the readout FET25 in FIG. 12, are impressed respectively on the drain 22 and the gate 21 thereof oppositely, so that the elemental picture signals appearing on the load resistor $R_{Y0}$ inserted into the path through which the readout source voltage $E_Y$ is impressed on the elemental converting devices are readout on the output terminal as the output picture signal voltage of the imaging apparatus. Moreover, in case the resistors $R_Y$ provided in FIG. 12 for releasing the remaining signal charges, so as to reduce the source voltages $E_Y$ and $E_R$ impressed on the horizontal leads Y to the ground potential when the Y scan switching has been effected, are replaced with FET's $Q_{YC}$ similarly as shown regarding the fourth row, that is, the last row, it can be expected to obtain the larger output picture signal and to realize the more rapid operation of the imaging apparatus.

Figure 15:
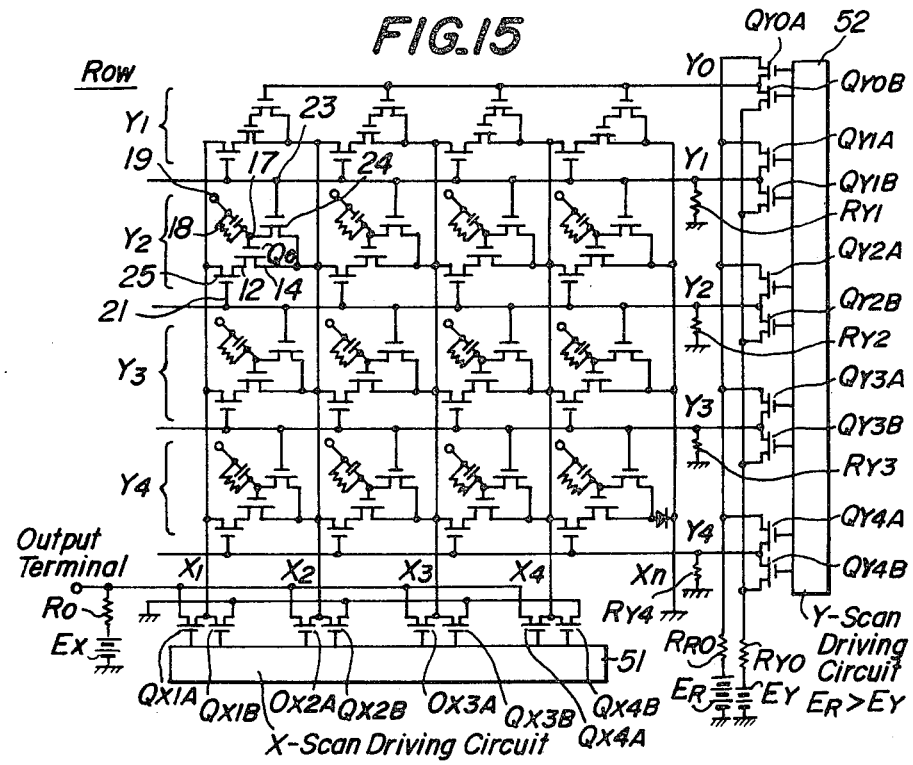

Similarly as mentioned above, further another example of the solid state imaging apparatus employing elemental converting devices according to the present invention as shown in FIG. 15 is arranged similarly also as shown in FIG. 12, except for the following modifications.

In the solid state imaging apparatus shown in FIG. 15, the sources of the reset FET24 and the amplifier FET $Q_0$, which are grounded, that is, connected commonly with the substrate of the converting device in FIG. 12, are connected commonly with the vertical leads X, which are grounded through the X scan switching FET's $Q_{XB}$ during the blanking period of the X scanning, so as to reset the elemental converting devices belonging the preceding row regarding which the readout of the elemental picture signals have been effected, so that the remaining signal charges can be released to the ground potential more rapidly than in case directly grounded or connected to the substrate as shown in FIG. 12, so as to ascertain the rapid operation of the imaging apparatus.

However, for instance, at the aforesaid time point $t_2$, when the second X scan switching FET $Q_{X2A}$ becomes conductive after the first X scan switching FET $Q_{X1A}$ has been made conductive, the latter FET $Q_{X1A}$ is not cut off immediately, so as to be maintained conductive until the horizontal scanning of the second row $Y_2$ has been finished.

In connection therewith, in case the diode 26 is inserted between the vertical lead X and the sources of the reset FET24 and the amplifier FET $Q_0$ in each of the elemental converting devices, the ordinary scanning can be performed similarly as in the imaging apparatus shown in FIG. 10.

Figure 16:
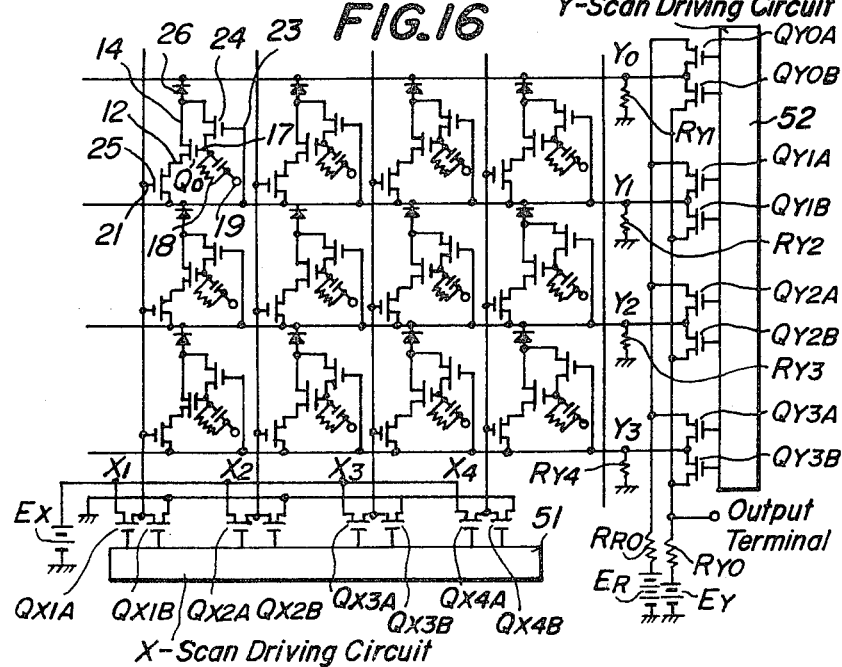

In the next place, further another example of the solid state imaging apparatus employing elemental converting devices according to the present invention as shown in FIG. 16 is arranged similarly as that shown in FIG. 14, except for the following modifications thereof.

In the solid state imaging apparatus shown in FIG. 16, the sources of the reset FET 24 and the amplifier FET $Q_0$, which are grounded by connecting with the substrate of the converting devices, are connected with the horizontal lead Y of the preceding row through the diode 26 for preventing the inverse flow of the signal charges, as well as the gate 23 of the reset FET 24 is connected with the horizontal lead Y together with the drain of the readout FET 25, on account thereof the more rapid and more reliable operation of resetting can be performed as described above by referring to FIG. 15.

In connection to the above modification of the arrangement of the elemental converting devices, the conduction of the Y scan switching FET $Q_{YA}$ for applying the reset source voltage $E_R$ to a certain horizontal lead Y is delayed by two X scanning periods from the conduction of the other Y scan switching FET $Q_{YB}$ for applying the readout source voltage $E_Y$ to the same horizontal lead Y, so that the time difference of two X scanning periods is caused between the reset source voltage $E_R$ and the readout source voltage $E_Y$ which are applied commonly to the same horizontal lead y. Accordingly, for instance, with respect to the elemental converting devices belonging to the second row of the matrix, the elemental picture signals have been readout with response to the application of the readout source voltage $E_Y$ to the drain of the readout FET 25 and then the reading out of the elemental picture signals of the elemental converting devices belonging to the third row is finished at the succeeding X scan period, those elemental converting devices belonging to the second row are reset all at once with response to the application of the reset source voltage $E_R$ to the gate 23 of the reset FET 24 at the further succeeding X scan period, namely two X scan periods after the reading out of the elemental picture signals therefrom.

Figure 17:
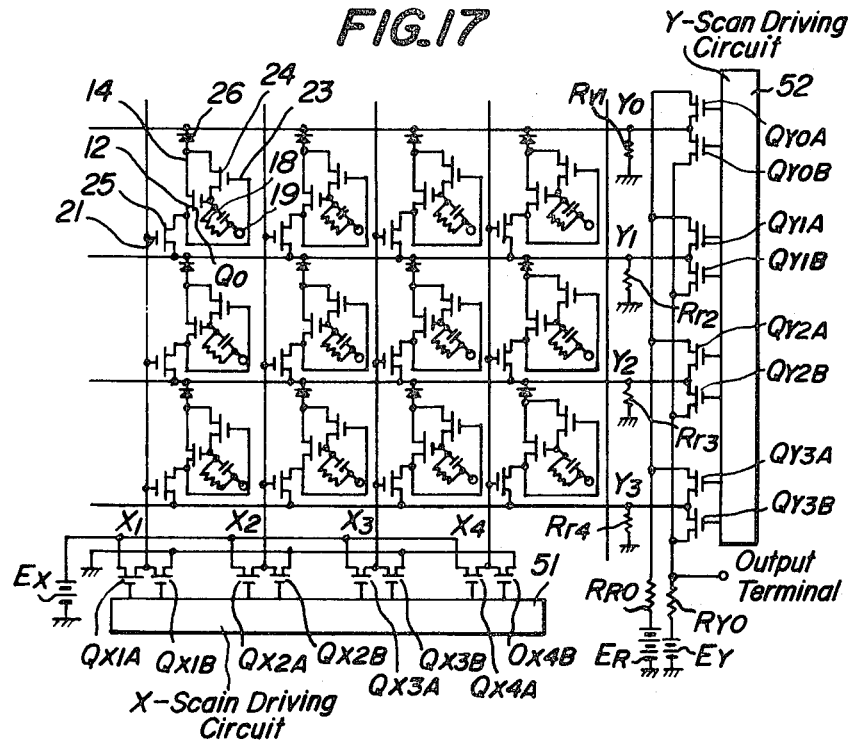

In the next place, further another example of the solid state imaging apparatus employing elemental converting devices according to the present invention as shown in FIG. 17 is arranged similarly as that shown in FIG. 16, except for such a modification that the gate 23 of the reset FET 24 and the drain 12 of the amplifier FET $Q_0$ are connected with each other in the respective elemental converting device, so that the imaging apparatus shown in FIG. 17 can be operated substantially similarly as that shown in FIG. 16.

However, because the gate 23 of the reset FET 24 in the respective elemental converting device is connected with the drain 12 of the amplifier FET $Q_0$, that is, the source of the readout FET 25 as mentioned above, even when the horizontal lead Y is applied with the reset source voltage $E_R$ similarly as in FIG. 16, it is not caused that the elemental converting devices belonging to the above horizontal lead Y are reset all at once, but, out of those elemental converting devices, only one device, in which the gate 21 of the readout FET 25 is connected with the vertical lead X applied with the signal source voltage $E_X$, is reset with response to the application of the reset source voltage $E_R$. As a result thereof, the elemental converting devices belonging to the horizontal lead Y which is applied with the reset source $E_R$ are reset sequentially with response to the sequential conduction of the X scan switching FET's $Q_X$.

Figure 18:
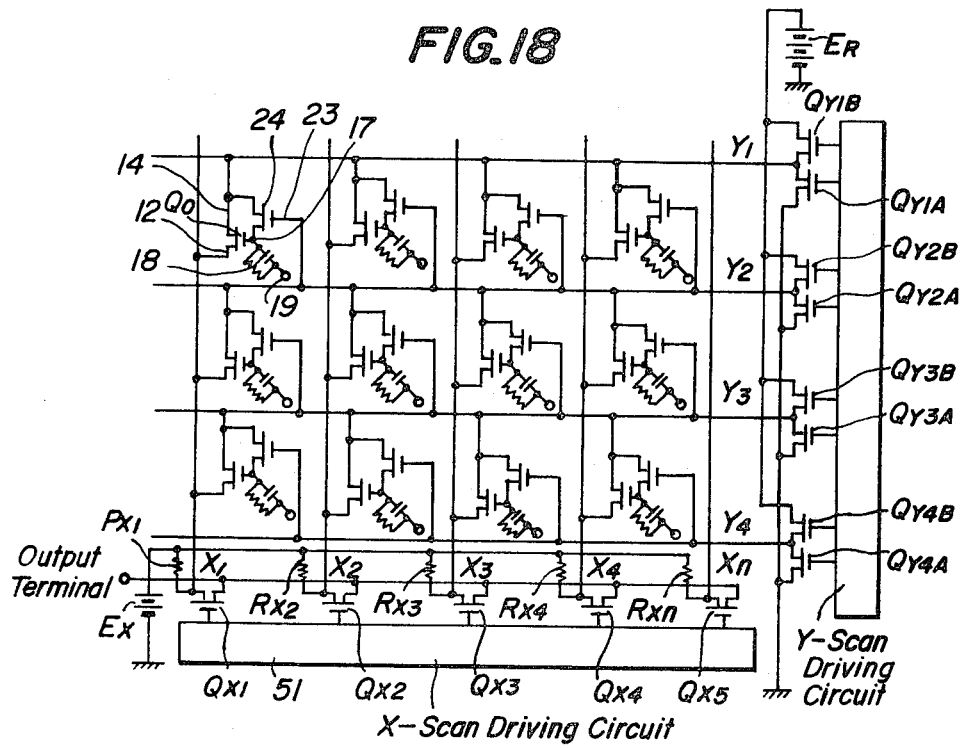

In the next place, further another example of the solid state imaging apparatus employing elemental converting devices according to the present invention as shown in FIG. 18 is arranged similarly as that shown in FIG. 16, except for such a modification that the diode 26 for preventing the inverse flow of the signal charge and the reset FET 25 are omitted, and further the behaviours of the Y scanning, the X scanning and the readout of the output picture signal are performed similarly as those in FIG. 15. That is, the behaviour of the imaging apparatus shown in FIG. 18 is performed as follows.

At the starting point $t_0$ of the frame scanning, the vertical leads $X_1$, $X_2$, $X_3$ and so on are applied with the signal source voltage $E_X$ through the resistors $R_{X1}$, $R_{X2}$, $R_{X3}$ and so on, as well as the Y scan switching FET $Q_{Y1A}$ only is conductive, so as to ground the horizontal lead Y only therethrough, so that all of the amplifier FET's $Q_0$ in the elemental converting devices belonging to the horizontal lead $Y_1$ are operated. Accordingly, the principal portions of the elemental picture signals, which are divided by the inner resistance of the amplifier FET $Q_0$ and the resistor $R_X$ respectively, are applied to the vertical leads X respectively. Those principal portions of the elemental picture signals on the vertical leads X are derived to the output terminal sequentially by the X scanning of the first row at the time points from $t_1$ to $t_n$.

At the horizontal blanking period succeeding to the above X scanning of the first row, the Y scan switching FET $Q_{Y1A}$ is maintained conductive, and another Y scan switching FET $Q_{Y2B}$ becomes conductive only at that period, so as to apply the reset source voltage $E_R$ to the gates 23 of the reset FET's 24 in the elemental converting devices belonging to the horizontal lead $Y_1$ all at once. As a result thereof, those elemental converting devices are reset all at once with response to the above application of the reset source voltage $E_R$ only, since the threshold voltage of the reset FET 24 is settled higher than the readout source voltage $E_X$ which is applied commonly to the vertical lead $X_1$.

Thereafter, at the starting point $t_{n+0}$ of the horizontal scanning of the second row, the aforesaid Y scan switching FET's $Q_{Y1A}$ and $Q_{Y2B}$ are cut off and still another Y scan switching FET $Q_{Y2A}$ becomes conductive, and then the horizontal scanning of the second row is performed at the time points from $t_{n+1}$ to $t_{2n}$ similarly as mentioned above.

In the last place, further another example of the solid state imaging apparatus employing elemental converting devices according to the present invention as shown in FIG. 19 is arranged similarly as that shown in FIG. 10, except for such a modification that the reset FET 24 in the respective elemental converting device is replaced with the resistor 27.

That is, in the imaging apparatus shown in FIG. 19, the resistor 27 is connected between the conductive electrode for collecting the induced signal charges and the ground potential, that is, the substrate of the converting device in place of the reset FET 24 employed in FIG. 10. Accordingly, the principal portion of the elemental picture signal consisting of the collected signal charges, which is divided by the resistor 27 and the inner resistance of the photo-conductive layer 18, which inner resistance is varied with response to the amount of the incoming light, is impressed on the collecting conductive electrode 17. With response to the application of the above principal portion of the elemental picture signal, which portion is varied with response to the amount of the incoming light, to the gate 13' of the amplifier FET $Q_0$, the imaging output signal voltage consisting of the portion of the signal source voltage $E_Y$, which is divided by the resistor $R_X$ connected with the vertical lead X and the inner resistance of the amplifier FET $Q_0$, which inner resistance corresponds to the amount of the incoming light finally, can be readout on the vertical lead X as the elemental output picture signal. The respective elemental output signals impressed on the vertical leads X can be derived through the output terminal sequentially by the sequential conduction of the X scan switching FET's $Q_X$.

In connection therewith, in case an additional FET amplifier 28 is provided for amplifying the above mentioned output picture signals, it is possible to obtain the larger output picture signal having the higher signal to noise ratio.

By the way, the above mentioned additional FET amplifier 28 can be provided for all of the preceding examples of the imaging apparatus similarly as shown in FIG. 19.

The signal voltage remaining on the collecting conductive electrode 17 in the respective elemental converting device is released gradually through the resister 27 in general. Further, the diode 26 provided for preventing the inverse flow of the elemental picture signal can be omitted as shown in FIG. 19 regarding the last row of the matrix by selecting the other operational conditions of the elemental converting device appropriately.

Apparently from the explained above, it is possible according to the present invention to obtain the output picture signal voltage of the solid state imaging apparatus with the one or two hundred times higher level in comparison with that of the conventional apparatus and the extremely excellent signal to noise ratio, and further to improve the signal to noise ratio of the output picture signal obtained by the solid state imaging apparatus remarkably in comparison all kinds of the conventional apparatus involving the so-called camer tube.

What is claimed is:

1. A photo-electric converting device, wherein an amount of an incoming light is converted into an electric signal, comprising
    a solid state photo-electric converting means consisting of at least
        a photo-transparent electrode layer,
        at least one photo-electric converting layer and
        a conductive electrode layer covering substantially the same area as said photo-electric converting layer for collecting signal charges converted from the incoming light in said at least one photo-electric converting layer, and
    a solid state amplifier means consisting of at least
        a control electrode layer being in conjunction with said conductive electrode layer for controlling said solid state amplifier means with response to said signal charges collected on said conductive electrode layer, and
        a plurality of semi-conductor layers including at least one sectional semi-conductor layer, conjugated with each other for amplifying a variation of an amount of said signal charges collected on said conductive electrode layer under the control of said control electrode layer.

2. A photo-electric converting device as claimed in claim 1, wherein said at least one photo-electric converting layer is a photo-conductive layer and said solid state amplifier means is a field effect transistor amplifier, further comprising
    a reset means for resetting said photo-electric converting device after an output signal of said solid state amplifier means is derived therefrom.

3. A photo-electric converting device, as claimed in claim 2, wherein said conductive electrode layer is directly in conjunction with a gate electrode of said field effect transistor amplifier.

4. A photo-electric converting device as claimed in claim 3, wherein said photo-conductive layer is formed of an SbS$_3$ chalcogenide.

5. A photo-electric converting device as claimed in claim 3, wherein said photo-conductive layer is formed of an Se-As-Te chalcogenide.

6. A photo-electric converting device as claimed in claim 2, wherein said conductive electrode layer is coupled with a gate electrode of said field effect transistor amplifier through a capacitance.

7. A photo-electric converting device as claimed in claims 2, wherein said photo-conductive layer is formed of an Se-As-Te cholcogenide.

8. A photo-electric converting device as claimed in claim 2, wherein said photo-conductive layer is formed of an SbS$_3$ chalcogenide.

9. A photo-electric converting device as claimed in claim 2, wherein said reset means consists of a resistor element connected with said gate electrode.

10. A photo-electric converting device as claimed in claim 1, wherein said at least one photo-electric converting layer is a photo-conductive layer and said solid state amplifier means is a bipolar transistor amplifier.

11. A photo-electric converting device as claimed in claim 10, wherein said photo-conductive layer is formed of an Se-As-Te chalcogenide.

12. A photo-electric converting device as claimed in claim 10, wherein said photo-conductive layer is formed of an SbS$_3$ chalcogenide.

13. A photo-electric converting device as claimed in claim 1, wherein said at least one photo-electric converting layer is a photo-conductive layer and said solid state amplifier means is a combination of a bipolar transistor amplifier and a field effect transistor amplifier, further comprising
    a reset means for resetting said photo-electric converting device after an output signal of said solid state amplifier means is derived therefrom.

14. A photo-electric converting device as claimed in claim 13, wherein said photo-conductive layer is formed of an Se-As-Te chalcogenide.

15. A photo-electric converting device as claimed in claim 13, wherein said photo-conductive layer is formed of an SbS$_3$ chalcogenide.

16. A solid state imaging apparatus wherein a plurality of said photo-electric converting devices as claimed in claim 1 are arranged in a matrix, comprising
    a plurality of first solid state switch means corresponding to a plurality of rows of said matrix for applying a source voltage for scanning in column direction to said photo-electric converting devices sequentially
    a plurality of second solid state switch means corresponding to a plurality of columns of said matrix for applying a source voltage for scanning in row direction to said photo-electric converting devices sequentially,
    a first scanning circuit for controlling said plurality of first solid state switch means sequentially, and
    a second scanning circuit for controlling said plurality of second solid state switch means.

17. A solid state imaging apparatus as claimed in claim 16, wherein said plurality of rows of said matrix is restricted to only one row.

18. A solid state imaging apparatus as claimed in claim 16, wherein said at least one photo-electric converting layer is a photo-conductive layer and said solid state amplifier means is a field effect transistor amplifier, further comprising
    a plurality of third solid state switch means corresponding to said plurality of rows for applying a source voltage for resetting said photo-electric converting devices to said photo-electric converting devices sequentially, and
    a reset scanning circuit for controlling said plurality of third solid state switch means sequentially.

19. A solid state imaging apparatus as claimed in claim 16, wherein said source voltage for scanning in column direction and a source voltage for resetting said photo-electric converting devices are applied alternately to a plurality of common leads for connecting said photo-electric converting devices commonly in row direction with a plurality of pairs of said first solid state switch means respectively through said plurality of pairs of said first solid state switch means respectively under the control of said first scanning circuit, said source voltage for scanning in column direction and said source voltage for resetting said photo-electric converting devices being settled as quite different from each other.

20. A solid state imaging apparatus as claimed in claim 16, wherein said at least one photo-electric converting layer is a photo-conductive layer and said solid state amplifier means is a field effect transistor amplifier, further comprising in said photo-electric converting devices as for respective reset means
- a plurality of resistor elements, one side ends of which are connected with gate electrodes of said field effect transistor amplifiers respectively and the other side ends of which are grounded.

* * * * *